United States Patent
Yamashita

[11] Patent Number: 5,844,809
[45] Date of Patent: Dec. 1, 1998

[54] METHOD AND APPARATUS FOR GENERATING TWO-DIMENSIONAL CIRCUIT PATTERN

[75] Inventor: Kyoji Yamashita, Yokohama, Japan

[73] Assignee: Kabushiki Kaisha Toshiba, Kawasaki, Japan

[21] Appl. No.: 687,625

[22] Filed: Jul. 26, 1996

[30] Foreign Application Priority Data

Jul. 28, 1995 [JP] Japan .................................. 7-193719

[51] Int. Cl.⁶ .................................................. G06F 17/50
[52] U.S. Cl. ........................................................ 364/489
[58] Field of Search ..................... 364/488, 489, 364/490, 491, 468.28; 382/144, 145, 181

[56] References Cited

U.S. PATENT DOCUMENTS

| | | | |
|---|---|---|---|
| 4,433,384 | 2/1984 | Berrian et al. | 364/525 |
| 4,531,191 | 7/1985 | Koyama | 364/491 |
| 4,744,047 | 5/1988 | Okamoto et al. | 364/900 |
| 4,783,829 | 11/1988 | Miyakawa et al. | 382/22 |
| 5,046,012 | 9/1991 | Morishita et al. | 364/468 |
| 5,185,812 | 2/1993 | Yamashita et al. | 382/8 |
| 5,253,182 | 10/1993 | Suzuki | 364/489 |
| 5,404,410 | 4/1995 | Tojo et al. | 382/50 |
| 5,663,893 | 9/1997 | Wampler et al. | 364/491 |

OTHER PUBLICATIONS

Wiley et al., "Comprehensive Detection of Defects on Reduction Reticles", SPIE, vol. 2196, (1994), pp. 219–233.

*Primary Examiner*—Kevin J. Teska
*Assistant Examiner*—Leigh Marie Garbowski
*Attorney, Agent, or Firm*—Foley & Lardner

[57] ABSTRACT

A method and an apparatus for generating, at a high speed, with high accuracy, a multi-gradation two-dimensional pattern without allowing graphic data of a two-dimensional circuit pattern to undergo bit development are provided. A scheme is employed to input coordinate values and external form dimensions of a plane figure to divide the coordinate values and the external form dimensions by sizes (dimensions) of pixels to normalize them to judge whether or not respective sides of the figure are included within the pixel sizes, whereby in the case where those sides are included, distances from central points of pixels to respective sides and angles thereof are determined with respect to all the pixels to determine density values of pixels by using the result to output the density values to an image memory to generate a two-dimensional circuit pattern within the memory.

7 Claims, 10 Drawing Sheets

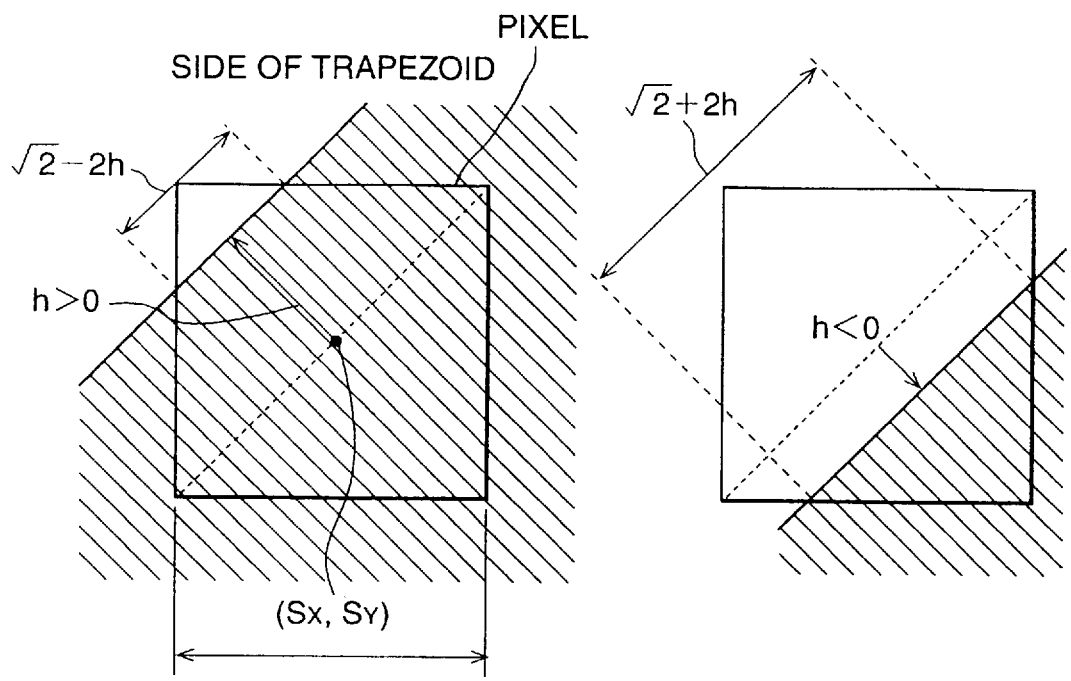
FIG.6A  FIG.6B
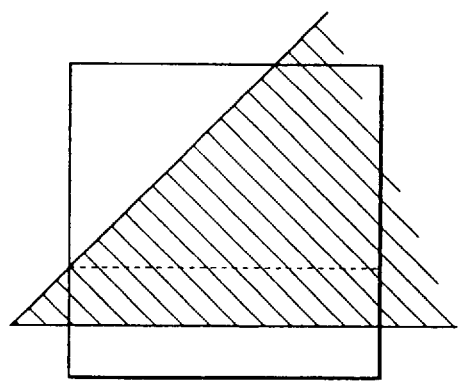
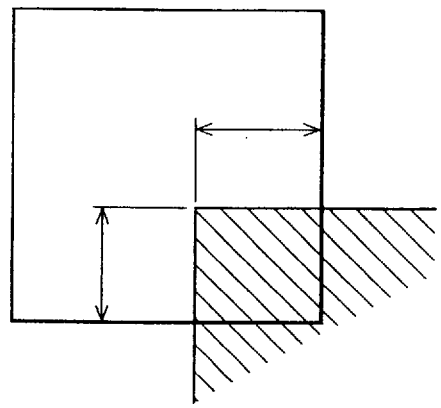
FIG.6C  FIG.6D

UPPER PIXEL : IN CASE OF $$|h| < \frac{\left|\frac{b}{c}\right| - 1}{2\sqrt{1 + \left(\frac{b}{c}\right)^2}}$$

LOWER PIXEL : IN CASE OF $$\frac{\left|\frac{b}{c}\right| - 1}{2\sqrt{1 + \left(\frac{b}{c}\right)^2}} < |h| < \frac{\left|\frac{b}{c}\right| + 1}{2\sqrt{1 + \left(\frac{b}{c}\right)^2}}$$

METHOD AND APPARATUS FOR GENERATING TWO-DIMENSIONAL CIRCUIT PATTERN

BACKGROUND OF THE INVENTION

This invention relates to a method and an apparatus for generating a two-dimensional circuit pattern, and more particularly to a two-dimensional circuit pattern generating method and a two-dimensional circuit pattern generating apparatus for developing a circuit pattern described on photo-mask or reticle, etc. into the image memory by density values of multi-gradation to thereby reproduce a two-dimensional circuit pattern to become useful for (profit) test (inspection), etc. of defect of the circuit pattern by using such two-dimensional circuit pattern.

In the apparatus for testing (inspecting) pattern defect in photo-mask or reticle, etc., there is ordinarily employed a system of comparing a tested pattern obtained as picture data and a reference pattern prepared from design data (graphic data) to detect the inconsistent (disagreement) portion therebetween as defect. Certainly, this system is reliable as compared to the system of comparing adjacent two tested patterns (die-to-die comparison system). However, it is required to generate reference pattern at a high speed. In addition, according as the Critical Dimensional (CDs) of the device are reduced, the requirement of position accuracy of the mask becomes more rigorous, and the number of graphics of the design data is also increased. For this reason, an apparatus capable of generating high accuracy reference pattern at a high speed has been demanded.

Furthermore, it is required to correspond to the requirement of position accuracy of the mask caused by a miniaturization of the circuit pattern, and the requirement of increase of figure number in accordance with optical proximity effect compensation, without decrease of a througout.

As an apparatus of this kind, there is an apparatus called, e.g., Drawing Channels of Data Preparation System KLA30 by KLA INSTRUMENTS CORPORATION. In such an apparatus as shown in FIG. 1, graphic data is caused to undergo bit development in units obtained by equally dividing pixel to determine these areas, i.e., the number of "1" (0–256) to represent multi-gradation. With this apparatus, however, in order to improve the position accuracy, it is required to increase the number of divisions, resulting in the problem that much time is required in the bit development by increase in the number of divisions.

FIG. 1 is an explanatory view showing an example of a conventional two-dimensional circuit pattern generating method in the equipment for testing pattern defect, and FIG. 2 is a flowchart showing a circuit pattern generating method in the conventional two-dimensional circuit pattern generating apparatus. In FIG. 2, at step ST61, design data of the two-dimensional circuit pattern is inputted. At the subsequent step ST62, trapezoidal coordinate values (coordinates) are inputted to the trapezoidal coordinate input section. Thereafter, at step ST63, the trapezoidal coordinate data thus inputted is developed into bit pattern by the bit pattern development section. At the subsequent step ST64, picture pattern is generated by the picture pattern generating section. The picture pattern thus generated is developed and stored into the image memory at step ST65.

As described above, in the system of generating two-dimensional circuit pattern, graphic data is subjected to bit development by units (pixel sizes) obtained by equally dividing pixel to determine these areas, i.e., the number of "1" (0–256), thus to represent multi-gradation.

SUMMARY OF THE INVENTION

In view of the above, an object of this invention is to provide a two-dimensional circuit pattern generating method and a two-dimensional circuit pattern generating apparatus which can generate, at a high speed, with high accuracy, two-dimensional circuit pattern of multi-gradation without allowing graphic data to undergo bit development, and which can precisely carry out test (inspection) of defect, or the like by using such two-dimensional pattern.

To achieve the above-mentioned object, a two-dimensional circuit pattern generating method according to this invention is directed to a two-dimensional circuit pattern generating method of developing a circuit pattern constituted by plane figure having at least one oblique side into an image memory in which plural pixels are respectively equidistantly disposed in length and breadth directions, the method comprising: a first step of inputting coordinate values and external form (shape) dimensions of the plane figure; a second step of dividing the coordinate values and the external form dimensions by sizes (dimensions) of respective pixels given in advance to normalize them; a third step of judging whether or not respective sides constituting the plane figure are included within the respective pixel sizes; a fourth step of determining, with respect to the pixels which have been judges that the respective sizes of the plane figure of the normalized coordinate values and external form dimensions are included, distances between their central points and the respective sides and angles thereof to judge whether or not data of the distances and the angles have been determined with respect to all the pixels within which the respective sides are included; a fifth step of determining density values of the pixels by using the result of the distances and the angles determined at the fourth step; and a sixth step of outputting the density values determined at the fifth step to the image memory to generate a two-dimensional pattern within the image memory.

In addition, a two-dimensional circuit pattern generating apparatus according to this invention comprises: trapezoidal coordinate input means for inputting trapezoidal coordinate values and external form (shape) dimensions of trapezoid with respect to a circuit pattern; arithmetic and control means operative to divide the coordinate values and the external form dimensions by sizes (dimensions) of respective pixels given in advance to normalize them to judge whether or not sides of the trapezoid are included within the individual pixel sizes, whereby in the case where corresponding side is included within corresponding pixel size, the arithmetic and control means determines distance from the center point of the corresponding pixel size to the corresponding side and angle thereof; picture pattern generating means for generating a picture pattern of the circuit on the basis of judgment result as to whether or not respective sides of the trapezoid are included within the individual pixel sizes by the arithmetic and control means and data relating to distances and angles in the case where those sides are included; and an image memory for storing the picture pattern relating to circuit generated by the picture pattern generating means.

As described above, in accordance with this invention, there is provided a two-dimensional circuit pattern generating system in which plane figure having at least one oblique side, i.e., plane figure which can be divided into trapezoid is developed into an image memory in which pixels are equidistantly disposed in length and breadth directions, characterized in that the system comprises the steps of inputting coordinate values and dimensions of the plane figure (trapezoid), determining density values of the pixels by using distances from pixels to the respective sides of the plane figure (trapezoid) and the result obtained by judging whether or not respective sides of the plane figure (trapezoid) are included within the pixel sizes to output such density value data to the image memory.

In accordance with the two-dimensional circuit pattern generating method and apparatus featured as above, it becomes possible to generate, at a high speed, with high accuracy, two-dimensional pattern of multi-gradation without allowing the graphic data to undergo bit development.

BRIEF DESCRIPTION OF THE DRAWINGS

In the accompanying drawings:

FIGS. 6A to 6D are explanatory views respectively showing how to determine distances from the centers of pixels of respective sides including oblique sides in the second embodiment shown in FIG. 3;

DETAILED DESCRIPTION OF THE PREFERRED EMBODIMENTS

A two-dimensional circuit pattern generating method and a two-dimensional circuit pattern generating apparatus according to preferred embodiments of this invention will now be described in detail with reference to the attached drawings.

The circuit pattern described on the photo-mask or the reticle, etc. is represented in the state divided into plane figures such as rectangle or trapezoid, etc. Also in such a case, individual trapezoidal shapes are developed into two-dimensional pattern of multi-gradation on the image memory to integrate them in pixel units, thereby making it possible to obtain two-dimensional pattern with respect to the entirety of the circuit pattern.

Figure 1:
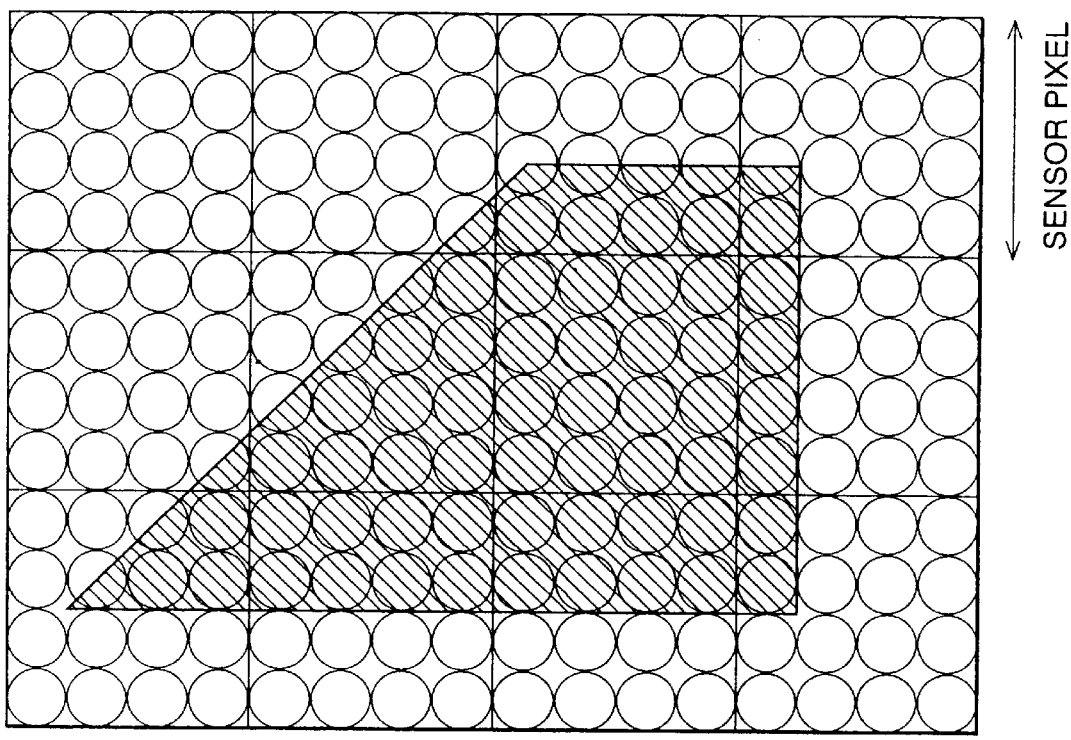
FIG. 1 is an explanatory view showing a conventional two-dimensional circuit pattern generating method in which figure data is developed into bit pattern.
Figure 2:
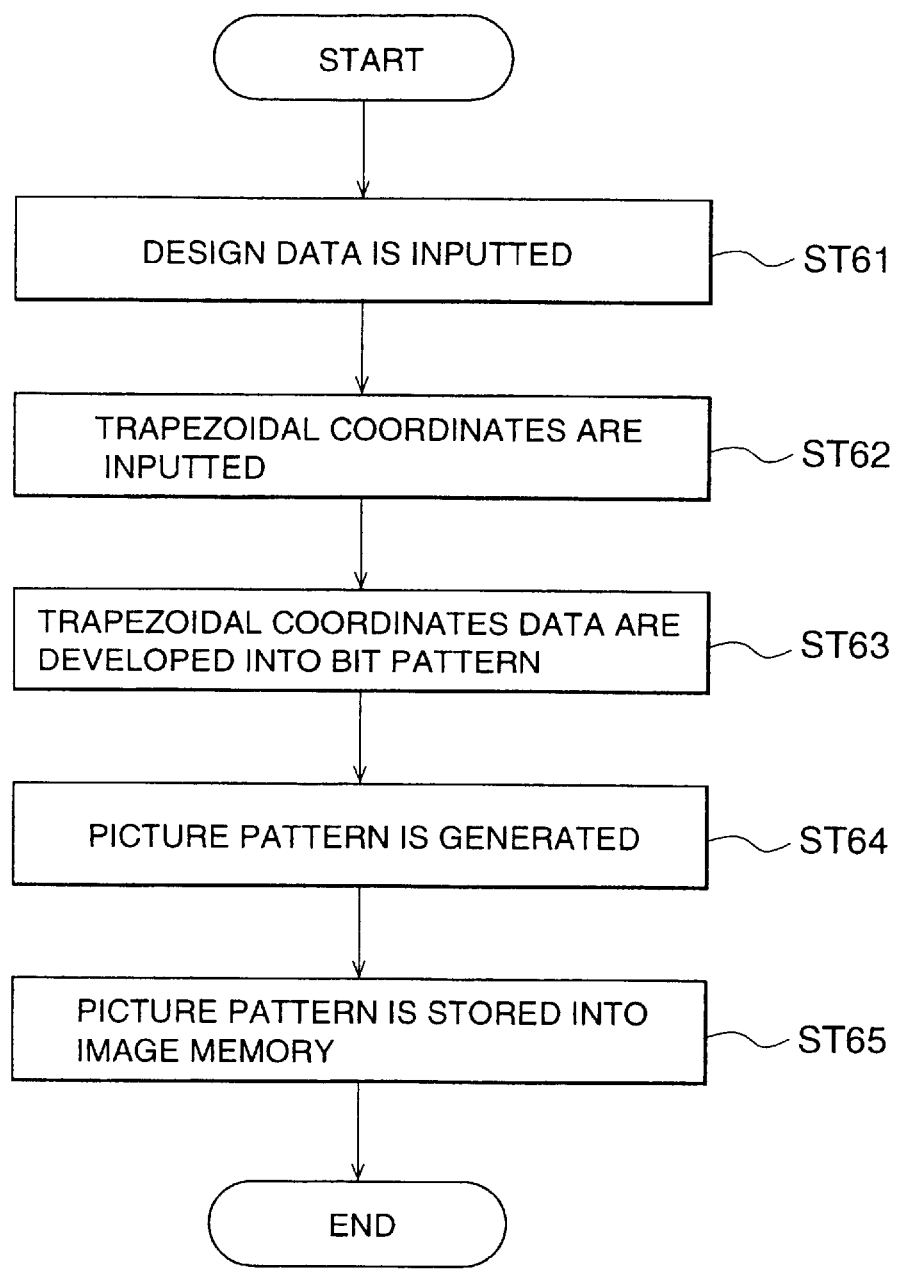
FIG. 2 is a flowchart showing operation steps of a conventional two-dimensional circuit pattern generating method.
Figure 3:
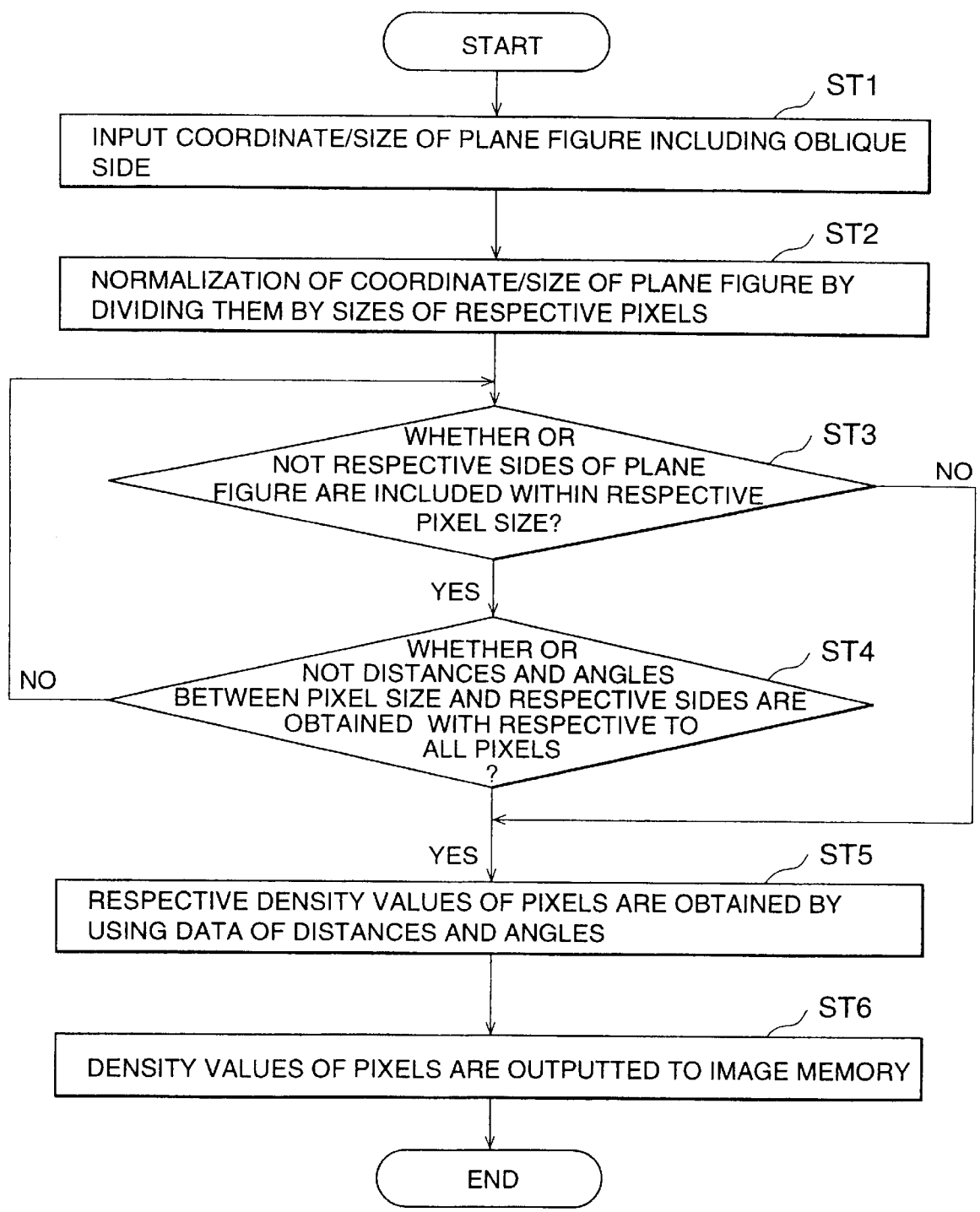
FIG. 3 is a flowchart showing operation steps of a two-dimensional circuit pattern generating method according to a first embodiment of this invention.

FIG. 3 is a flowchart showing operation steps of a two-dimensional circuit pattern generating method according to a first embodiment of this invention. In the figure, coordinate values and external form dimensions of a circuit pattern which takes a shape of plane figure, e.g., trapezoid, etc. provided with at least one oblique side are inputted (first step ST1). At second step ST2, the coordinate values and the external form dimensions of the trapezoid are normalized by dividing the coordinate values and the external form dimensions of the trapezoid inputted at the first step ST1 by sizes (dimensions) of respective pixels.

At third step ST3, whether or not respective sides of the plane figure including oblique side, e.g., trapezoid, etc. are included within respective pixel sizes is judged. In the case where it is judged that even any one portion of respective sides is included, data relating to distances from the central points of respective pixel sizes to respective sides included within those pixel sizes and angles thereof are determined with respect to respective pixels at step ST4. At the fourth step ST4, whether or not the distances and the angles have been determined with respect to all pixels if further judged. In the case where it is judged that data of distances and angles have been determined with respect to all the pixels, the processing operation shifts to the firth step ST5.

On the other hand, at the third step ST3, in the case where it is judged that corresponding pixel does not includes even one portion of any side of the plane figure, i.e., in the case where corresponding pixel is located at the outside or the inside of the contour of the plane figure, the processing operation jumps to the fifth step ST5 without routing the fourth step ST4. It is to be noted that the processing operations of the third and fourth steps ST3 and ST4 are repeated until determinations of distances between the center points of the pixel sizes and respective sides and angles thereof are completed with respect to all pixels.

By using data of distances between the all pixels and respective sides of the contour of the plane figure and angle data thereof, respective density values of pixels belonging to the area within the contour are determined at the fifth step ST5. Then, at sixth step ST6, the determined density values of pixels are outputted to the image memory. In this image memory, corresponding plane figure is developed on the basis of the inputted density values. Thus, two-dimensional circuit pattern is generated from the image memory.

While explanation has been given by taking the example of the plane figure provided with at least one oblique side in the above-described two-dimensional circuit pattern generating method according to the first embodiment, trapezoid as a typical example will be described in the second embodiment shown in FIG. 5.

Figure 4:
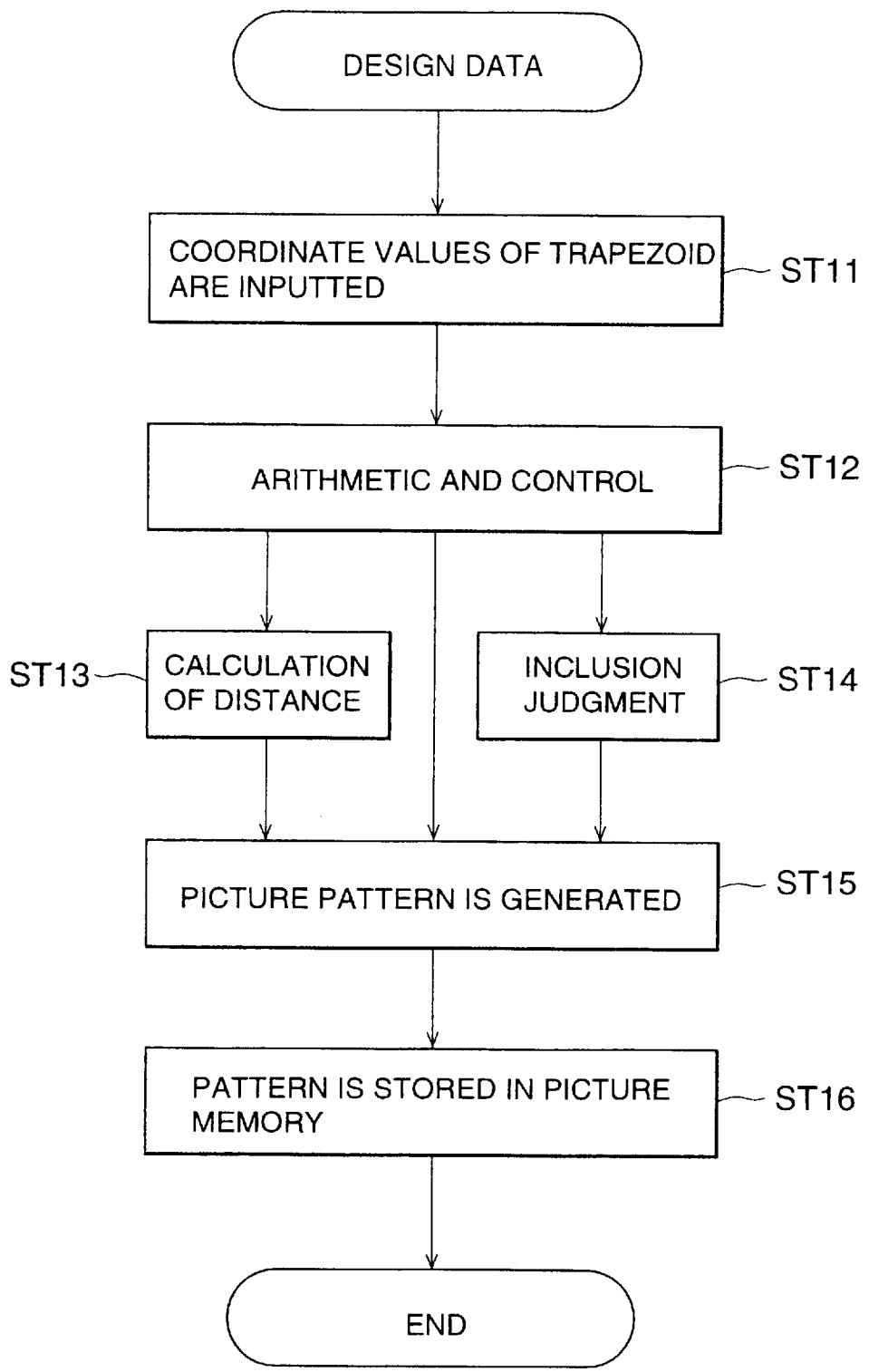
FIG. 4 is a flowchart showing operation steps of a two-dimensional circuit pattern generating method according to a second embodiment of this invention.
Figure 5B:
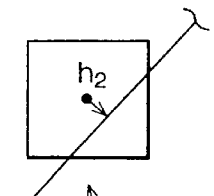
FIGS. 5A to 5E are explanatory views respectively showing how to determine respective sides of trapezoid in the second embodiment shown in FIG. 3.
Figure 5C:
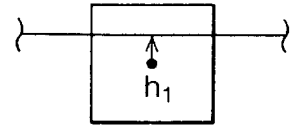
Figure 5A:
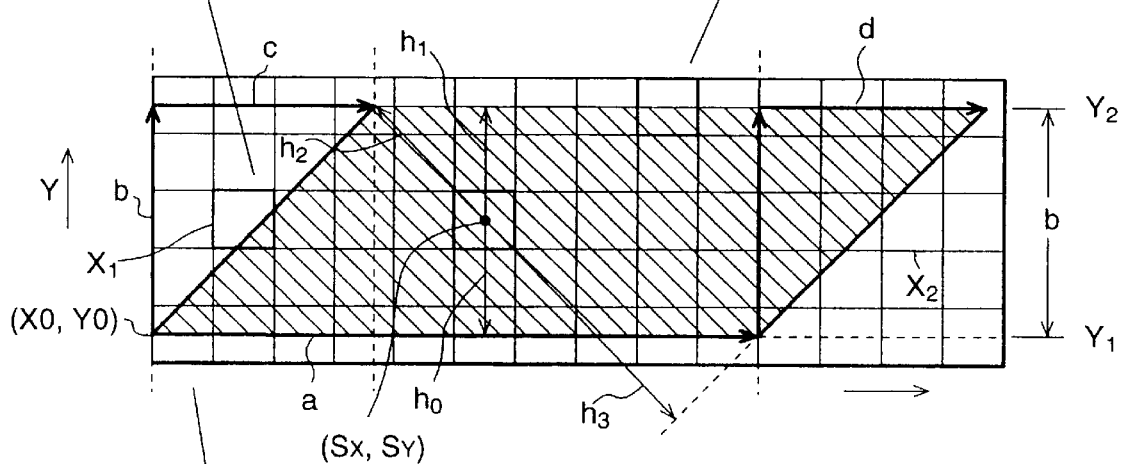
Figure 5D:
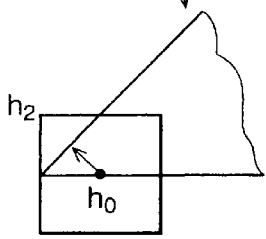
Figure 5E:
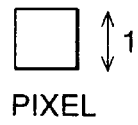

In the following description, explanation will be given by taking the example where trapezoid which represents circuit pattern is an isosceles trapezoid consisting of only sides having directions of 0 degrees, 45 degrees and 135 degrees. Initially, assuming that the left lower vertex coordinates are (x0, y0) and the base and height are respectively designated at a and b as shown in FIG. 4, vectors from the point drawn onto the upper side from both ends of the base up to the both ends of the upper sides are respectively represented by c and d.

In this case, b is positive, and c and d are 0 (zero) or positive or negative. In the case of the sides having directions of 90 degrees, 45 degrees and 135 degrees, there respectively result c=0, c=b, c=−b, and d=0, d=b and d=−b. These coordinate values are normalized so that the pixel size becomes equal to 1. Moreover, plane figure except for the trapezoid, e.g., 45 degrees right triangle can be represented by suitably selecting parameters of a, b, c, and d. In addition, the maximum value of the density gradation is the k-th power of 2 when depth of the image memory is k bits. For example, in the case of depth of 8 bits, the density gradation becomes equal to 256 at the maximum.

The method of generating trapezoidal circuit pattern according to the second embodiment of this invention will now be described with reference to FIG. 4.

Initially, at first step ST11, coordinate values of trapezoid having the above-mentioned shape are inputted. Correspondence between the coordinate and pixel as in the case of the example is caused to be established by operation (arithmetic and control) ate step ST12.

The distance calculation step and the inclusion judgment step at steps ST13 and ST14 will now be described. Quantity hi (i=0–3) of which absolute values represent distances to the four sides, and represents the internal of the trapezoid when its sign is positive is defined as follows:

$$h_0 = s_y - y_0 \tag{1}$$

$$h_1 = -(s_y - y_0) + b \tag{2}$$

$$h_2 = \frac{S_x - X_0 - \frac{c}{b}(S_y - Y_0)}{\sqrt{1 + \left(\frac{c}{b}\right)^2}} \tag{3}$$

$$h_3 = \frac{-(S_x - X_0)\frac{d}{b}(S_y - Y_0) + a}{\sqrt{1 + \left(\frac{d}{b}\right)^2}} \tag{4}$$

At the arithmetic and control step ST12, calculation is carried out with respect to pixels within the trapezoid and in the vicinity of the boundary line, as shown in FIGS. 6A–6D. In accordance with this calculated result, e.g., the picture pattern generating circuit, and the like are controlled. In this case, (Sx, Sy) is assumed to be center position of pixel.

1. Test is conducted whether or not the left side has directions of 45 degrees, 135 degrees (c≈0).
2. Test is conducted whether or not the right side has directions of 45 degrees, 135 degrees (d≈0).
3. The range [y1, y2] of pixel in the y direction within which the trapezoid is included is determined.
4. The following processing are repeated in connection with line y=sy in parallel to the lower side of the trapezoid from sy=y1 up to y2.
   (a) h0 and h1 to the upper side and the lower side of the trapezoid are calculated.
   (b) The range [x1, x2] of pixel in the x-direction from intersecting points of y=sy and the left and right sides of the trapezoid is determined.
   (c) The following processing is repeated in connection with the range from sx=x1 to x2.
      i) h2 and h3 to the left and right sides of the trapezoid are calcualted.
      ii) Pixel pattern of multi-gradation of pixel (sx, sy) is generated.

In this case, (sx, sy) are the central position of pixel, and are determined by the arithmetic and control step of the step ST12.

Finally, generation of picture pattern indicated at the step ST15 will be described.

1. Test is conducted as to whether or not absolute values of h0, h1, i.e., distances are greater than [½].
2. Moreover, if the left side has directions of 45 degrees, 135 degrees, test is conducted as to whether or not absolute value of h2 is greater than $1/\sqrt{2}$. Further, if the left side has directions of 0 degrees, 90 degrees, test is conducted as to whether the absolute value of h2 is greater than [½].
3. If the left side has directions of the 45 degrees, 135 degrees, test is conducted as to whether or not absolute value of h3 is greater than $1/\sqrt{2}$. Moreover, if the left side has directions of 0 degrees, 90 degrees, test is conducted as to whether or not absolute value of h3 is greater than [½].
4. In the case where all of distances up to four sides of the trapezoid is great, the following processing is executed.

When corresponding position is within the trapezoid, i.e., all of hi are positive, value obtained by multiplying 1 by density gradation of image is assumed to be density value of pixel. If otherwise, value obtained by multiplying 0 by density gradation of image is assumed to be density value of pixel.

5. In the case where at least three of distances up to four sides of the trapezoid are great, the following processing is expected.
   (a) In the case where the side of the minimum distance has directions of 0 degrees and 90 degrees, when hm<−½, value obtained by multiplying 0 by density gradation of image is assumed to be density value of pixel; when hm>−½, value obtained by multiplying 1 by the density gradation of image is assumed to be density value of pixel; and when others, value obtained by multiplying −½+$h_m$ by density gradation of image is assumed to be density value of pixel.
   (b) In the case where the side has direction of 45 degrees and 135 degrees similarly to the above, when hm<−1/√2, value obtained by multiplying 0 by the density gradation of image is assumed to be density value of pixel; when hm>−1/√2, value obtained by multiplying 1 by the density gradation of image is assumed to be density value of pixel; and when others, value obtained by multiplying the value defined below by the density gradation of image is assumed to be density value of pixel:

$$\frac{1}{2} + (\sqrt{2} - |h_m|)h_m \tag{5}$$

where $|h_m|$ is absolute value of $h_m$.

Namely, as shown in FIGS. 6A to 6D, when hm is positive, the pixel density value takes a value obtained by adding 45 degrees right triangle and area of the trapezoid partitioned by broken lines, while when hm is negative, it takes a value obtained by subtracting the area of the trapezoid from the 45 degrees right triangle.

6. In the case where otherwise, the following processing operation is executed.
   (a) When all of four lines consist of line segments of directions of 0 degrees and 90 degrees,
      i) Value obtained by multiplying a value obtained by dividing area given by product of length and breadth of rectangle included within pixel by the pixel by the density gradation of image is assumed to be density value of pixel.
   (b) When otherwise
      i) Intersecting points of the left side and the right side of the trapezoid and the boundary of pixel are determined.

A. If any intersecting point exists, the trapezoid is divided by linear line passing through the intersecting point and in parallel to the lower bottom of the trapezoid to determine areas of the divided portions.

B. Sum total of these areas is determined.

ii) Value obtained by multiplying value obtained by dividing the sum total by the area of pixel by the density gradation of picture is assumed to be density value of pixel.

The two-dimensional circuit pattern determined at the steps ST11 to ST15 is developed into the image memory and is stored thereinto at the step S16.

Figure 7:
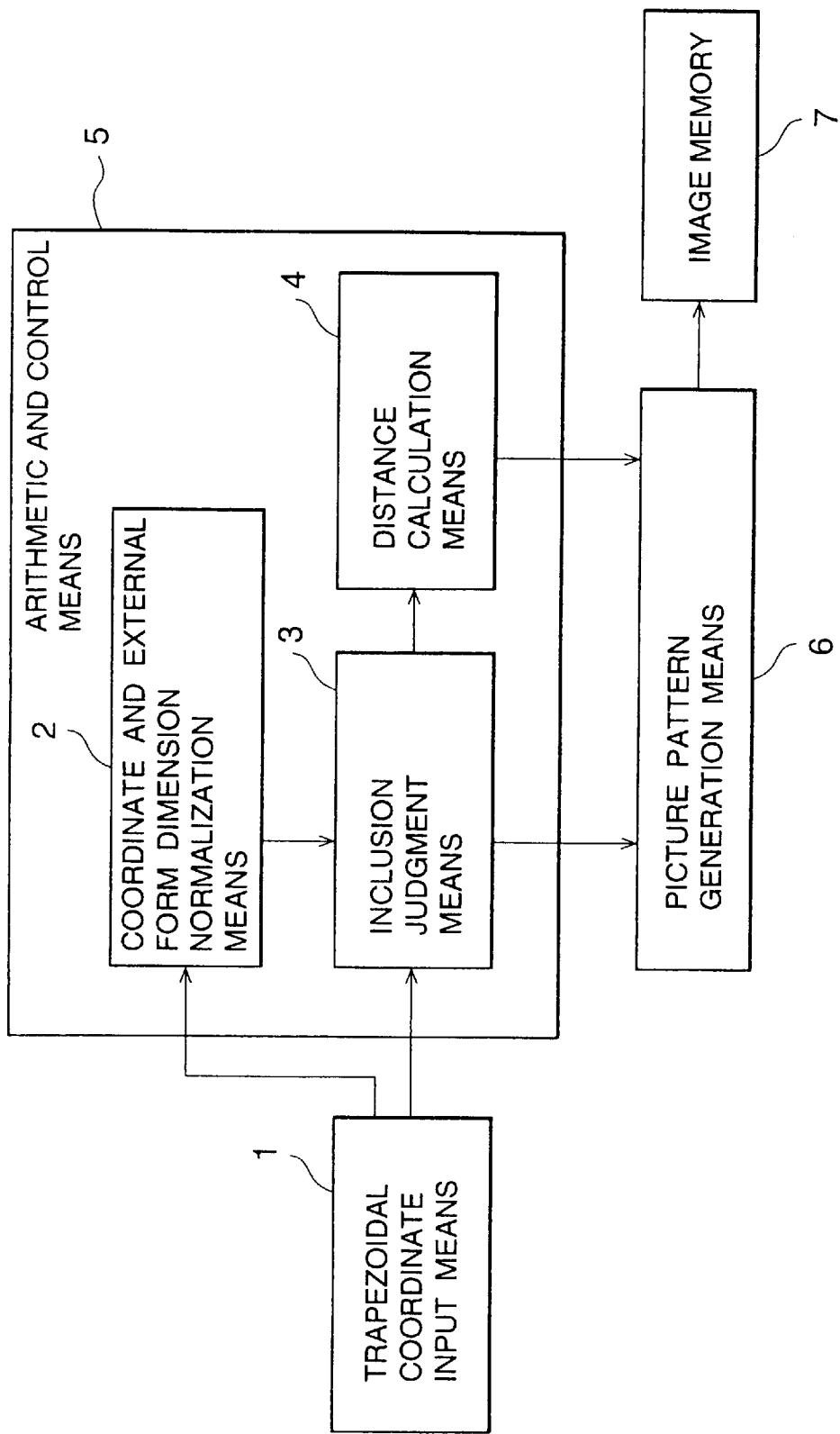
FIG. 7 is a block digram showing outline of the configuration of a two-dimensional circuit pattern generating apparatus according to a third embodiment of this invention.

Finally, a two-dimensional circuit pattern generating apparatus according to the third embodiment of this invention will be described with reference to FIG. 7. In FIG. 7, the generating apparatus comprises trapezoidal coordinate input means 1 for inputting circuit pattern of trapezoid, arithmetic and control means 5 for dividing trapezoid coordinate values and external form (shape) dimensions by size (dimension) of pixel given in advance to judge whether or not pixel is included within the trapezoid, whereby in the case where the trapezoidal coordinate values are included within the pixel, the means 5 calculates the distance and the angle thereof to output its judgment result and distance/angle, etc., picture pattern generation means 6 for generating picture pattern on the basis of output of the arithmetic and control means 5, and an image memory 7 for storing thereinto the generated picture pattern. More particularly, the arithmetic and control means 5 comprises coordinate and external form dimension normalization means 2 for dividing the coordinate values and the external form dimensions of the trapezoid by the size (dimension) of pixel to normalize them, inclusion judgment means 3 for judging on the basis of an output of the trapezoidal coordinate input means 1 and an output of the coordinate and external form dimension normalization means 2 whether or not the contour of the trapezoid is included, and distance calculation means 4 operative so that in the case where the contour of the trapezoid is included within the pixel, the means 4 calculates distance from the pixel center point up to the side within the pixel and the angle thereof.

As described above, in accordance with this invention, it becomes possible to generate, at a high speed, high accuracy multi-gradation two-dimensional pattern without allowing graphic data to undergo bit development.

Figure 8:
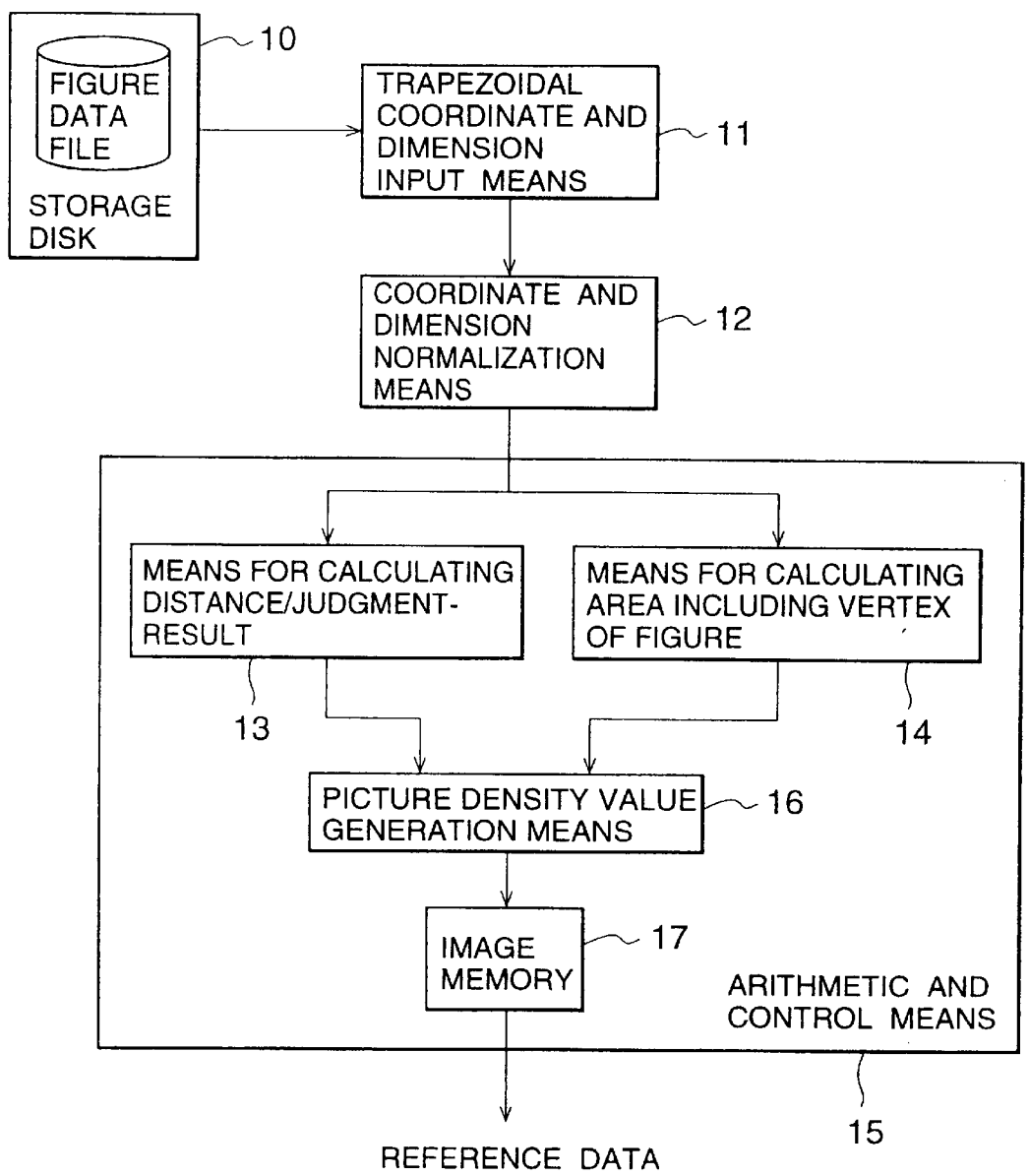
FIG. 8 is a block diagram showing a configuration of a two-dimensional circuit pattern generating apparatus according to a fourth embodiment of this invention.

Next, there will be described a two-dimensional circuit pattern generating apparatus according to a fourth embodiment of this invention with reference to a block diagram shown in FIG. 8.

In the following description, explanation will be given by taking the example where coordinates and dimension are inputted with respect to trapesoid including an oblique side of an arbitrary angle in order to generate reference data having multi-gradation density values corresponding to a sensor picture. In FIG. 8, the two-dimensional circuit pattern generating apparatus according to the fourth embodiment comprises a disk 10 for storing a figure data file, means 11 for inputting coordinates and dimension of trapesoid, means 12 for normalizing the coordinates/dimension, calculation control means 15 for generating reference data, and means 18 for outputting the reference data. The calculation control means 15 further comprises means 13 for calculating a distance and for judging an inclusion, means 14 for calculating an area at vertexes of the figure, means 16 for generating picture density values, and an image memory 17 for storing the picture density values.

In the above configuration, the means 11 reads out the figure data file at high speed from the disk 10, and inputs the coordinates and dimension of trapesoid from the figure data file. After that, the means 12 normalizes the coordinates and dimension of trapesoid as a pretreatment. Then, the means 13 judges distances between the center of pixel and four sides of trapesoid and as to whether the center of pixel is inside or outside of the trapesoid, and at the same time the means 14 calculates area of trapesoid occupying in the pixel which includes any of vertexes of trapesoid. The means 16 receives these results from the means 13 and 14, and generates the picture density values with respect to all the pixels in which the trapesoid is includes so as to write the values into the image memory 17. If there is any trapesoid to be treated, the same treatment is performed to the trapesoid to add the density values on the values which have already been written in the memory. When there is no trapesoid to be treated, the means 18 outputs the reference data after determining that the treatment is completed.

Figure 9:
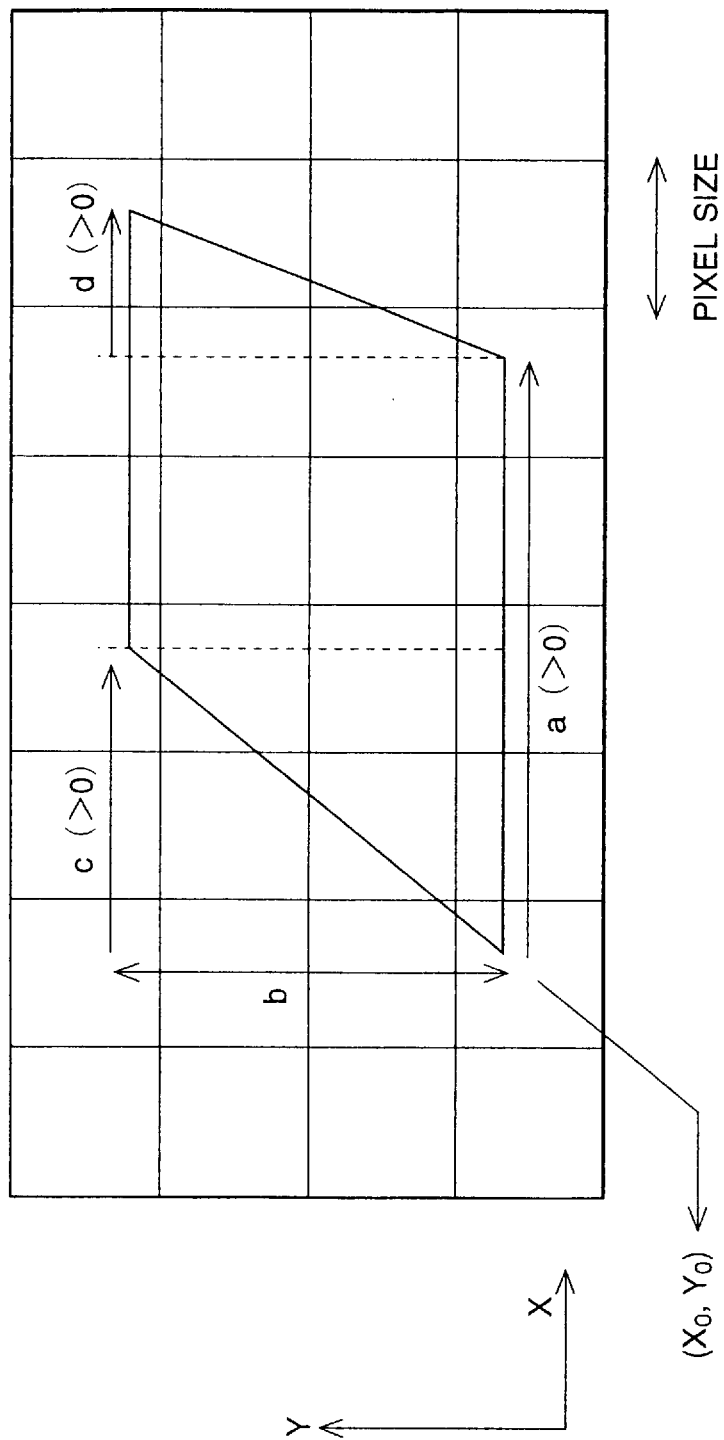
FIG. 9 is an explanatory view showing a two-dimensional circuit pattern generating method according to a fifth embodiment of this invention.

There will be described a method for generating a circuit pattern with reference to FIGS. 9 and 10 by using the two-dimensional circuit pattern generating apparatus having the above configuration shown in FIG. 8.

There is described as an example a method for calculating a density value near an oblique side of trapesoid having an arbitrary angle. Here, the density value is defined by a rate of which the figure occupies in a pixel, and the rate is represented by real numbers from 0 to 1. At first, as shown in FIG. 9, when a coordinate at the lower left vertex of trapesoid is (X0, Y0), the base is a (>0), and the height is b(>0), it is possible to represent vectors from both points of the upper base respectively corresponding to both ends of the lower base to both ends of the upper base by c(>0) and d(>0), respectively. Here, these coordinates are normalized by a pixel size.

A distance from pixel center coordinates (Sx, Sy) to an oblique line of trapesoid is an absolute value of "h" which is represented by equations (1)–(4).

$$h_o = S_y - Y_o \tag{1}$$

$$h_1{}^m - (S_y - Y_o) + b \tag{2}$$

$$h_2 = \frac{S_X - X_o - \frac{c}{b} \cdot (S_y - Y_0)}{\sqrt{1 + \left(\frac{c}{b}\right)^2}} \tag{3}$$

$$h_3 = \frac{-(S_X - X_0) + \frac{d}{b} \cdot (S_y - Y_0) + a}{\sqrt{1 + \left(\frac{d}{b}\right)^2}} \tag{4}$$

While a sign with "h" becomes plus when the pixel center is inside of a trapesoid, it becomes minus when the pixel center is outside of a trapesoid.

There will be described a calculation method of density values by taking an example of "h2". Accordingly, "h2" is represented as a simple "h" hereinbelow. It is possible to calculate other sides by the same manner. Here, a sign function sgn (x) is defined by an equation (6), and |h| is an absolute value of h.

$$sgn(x) = \begin{cases} 1 & ; \text{if } x > 0 \\ 0 & ; \text{if } x = 0 \\ -1 & ; \text{if } x < 0 \end{cases} \tag{6}$$

-continued $$V = \begin{cases} \frac{1}{2} + \left|\frac{c}{b}\right| \cdot \sqrt{1+\left(\frac{b}{c}\right)^2} \cdot h; \\ \quad \text{if } 0 < |h| < \dfrac{\left|\frac{b}{c}\right|-1}{2\sqrt{1+\left(\frac{b}{c}\right)^2}} \\ \frac{1}{2} + \left|\frac{c}{b}\right| \cdot \left[\sqrt{1+\left(\frac{b}{c}\right)^2} \cdot h - \frac{1}{2} \cdot sgn(h) \cdot \right. \\ \quad \left. \left\{\left\{1+\left(\frac{b}{c}\right)^2\right\}h^2 + \frac{1}{4}\left(\left|\frac{b}{c}\right|-1\right)^2\right\}\right]; \\ \quad \text{if } \dfrac{\left|\frac{b}{c}\right|-1}{2\sqrt{1+\left(\frac{b}{c}\right)^2}} < |h| < \dfrac{\left|\frac{b}{c}\right|+1}{2\sqrt{1+\left(\frac{b}{c}\right)^2}} \\ 0 \,; \text{if otherwise} \end{cases} \quad (7)$$

In a condition of "0<1 c/b 1<1, a densityv alue V is represented by an equation (7). As shown by a dotted line in FIG. 10, when a side passes through the pixel center, namely in the case of a line AB and h=0, there becomes V=½ in spite of a value of an oblique c/b. In the case of an upper pixel of two pixels shown in FIG. 10, the density value to be obtained by the oblique side (line (D)) is additional value of an area of ½ in the case of h=0 and an area of a parallelogram ABCD. As has been clearly understood from FIG. 10, the density value if proportional to "h".

Figure 10:
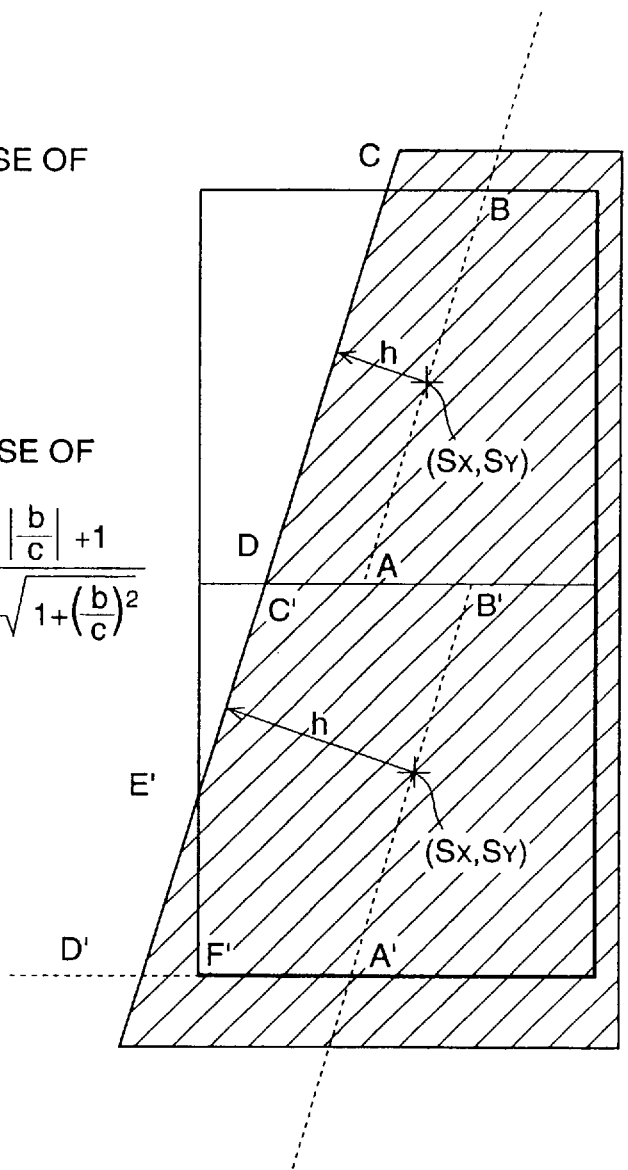
FIG. 10 is an explanatory view showing a density value calculating method as an example of the two-dimensional circuit pattern generating method according to the fifth embodiment shown in FIG. 9.

In the case of the lower pixel in two pixels shown in FIG. 10, the density values to be obtained are calculated in the manner of subtracting an area of a triangle d'E'F' from an addition of an area ½ and an area of a parallelogram A'B'C'D' with respect to an oblique side CD.

In a condition "1<|c/b|"⇆"|b/c|<1", symbols b and c in the equation (6) are exchanged with each other and the density value can be obtained by the following equation (8):

$$V = \begin{cases} \frac{1}{2} + \left|\frac{b}{c}\right| \cdot \sqrt{1+\left(\frac{c}{b}\right)^2} \cdot h; \\ \quad \text{if } |b| < \dfrac{\left|\frac{c}{b}\right|-1}{2\sqrt{1+\left(\frac{c}{b}\right)^2}} \\ \frac{1}{2} + \left|\frac{b}{c}\right| \cdot \left[\sqrt{1+\left(\frac{c}{b}\right)^2} \cdot h - \frac{1}{2} \cdot sgn(h) \cdot \right. \\ \quad \left. \left\{\left\{1+\left(\frac{c}{b}\right)^2\right\}h^2 + \frac{1}{4}\left(\left|\frac{c}{b}\right|-1\right)^2\right\}\right]; \\ \quad \text{if } \dfrac{\left|\frac{c}{b}\right|-1}{2\sqrt{1+\left(\frac{c}{b}\right)^2}} < |h| < \dfrac{\left|\frac{c}{b}\right|+1}{2\sqrt{1+\left(\frac{c}{b}\right)^2}} \\ 0 \,; \text{if otherwise} \end{cases} \quad (8)$$

In the case of a side having a direction of 90 degrees, it is possible to represent by an equation (9) as the limit of "c/b→0" in the equation (7). Furthermore, h is the same value with respect to pixels including no vertex and through which the oblique side of trapesoid passes. Accordingly, since the density values in these pixels are constant, it is sufficient to calculate the density value in one pixel per one side.

$$V = \begin{cases} \frac{1}{2} + h \,; \text{if } |h| < \frac{1}{2} \\ 0 \,; \text{if otherwise} \end{cases} \quad (9)$$

In the case of a side having a direction of 45 or 135 degrees, the condition corresponds to |c/b|=1 in the equation (7) and (8) and it can be represented by an equation (10):

$$V = \begin{cases} \frac{1}{2} + (\sqrt{2} - |h|) \cdot h \,; \text{if } |h| < \frac{\sqrt{2}}{2} \\ 0 \,; \text{if otherwise} \end{cases} \quad (10)$$

Furthermore, h is the same value with respect to pixels including no vertex and through which the oblique side of trapesoid passes. Accordingly, since the density values in these pixels are constant, it is sufficient to calculate the density values in one pixel per one side.

There has already been described in detail a method for calculating the density value with respect to pixels including vertexes of trapesoid in the two-dimension circuit pattern generating method and apparatus according to the first through third embodiments.

Accordingly, the density value of pixels is obtained in the manner that an area is calculated when the plane figure is trapesoid, and that an addition of areas of particular trapesoids which are divided from the plane figure without trapesoid. Duplicated description will be omitted.

As described above, it is possible for this invention to generate two-dimensional circuit pattern having a small quantization error and high accurate multi-gradation without developing the figure data into bit data.

What is claimed is:

1. A two-dimensional circuit pattern generating method of developing a circuit pattern constituted by plane figure including at least one oblique side into an image memory in which plural pixels are respectively equidistantly disposed in length and breadth directions, the method comprising:

a first step of inputting coordinate values and external form dimensions of the plane figure;

a second step of dividing the coordinate values and the external form dimensions by sizes (dimensions) of respective pixels given in advance to normalize them;

a third step of judging whether or not respective sides constituting the plane figure are included within the pixel sizes;

a fourth step of determining distances between the central point and the respective sides and angles thereof in the pixels which have been judged that the respective sides of the plane figure are included to judge whether or not data of the distances and the angles have been determined with respect to all pixels within which the respective sides are included;

a fifth step of determining density values of the pixels by using the result of the distances and the angles determined at the fourth step; and a sixth step of outputting the density values determined at the fifth step to the image memory to generate a two-dimensional pattern within the image memory.

2. A two-dimensional circuit pattern generating method as set forth in claim 1, wherein the plane figure is a figure which can be divided into trapezoid, the method comprising:

a step such that in the case where there holds the condition where when the side of the trapezoid has directions of 0 degrees and 90 degrees with respect to the side of the pixel, distance from the pixel up to the side of the trapezoid is greater than one half of size (dimension) of the pixel, and in the case where there holds with respect to all sides of the trapezoid the condition where when the side of the trapezoid has directions of 45 degrees and 135 degrees with respect to the side of the pixel, the distance from the pixel up to the side of the trapezoid is greater than one half of diagonal line of the pixel, values obtained by multiplying 1 and 0 by density gradation of the pixel on the basis of judgement as to whether or not the respective sides of the trapezoid are included within the pixel sizes are caused to be respectively density values of the pixel.

3. A two-dimensional circuit pattern generating method as set forth in claim 1, wherein the plane figure is a figure which can be divided into trapezoid, the method comprising:

a step in which in the case where there exist at least two trapezoids such that when the side of the trapezoid has directions of 0 degrees and 90 degrees, distance from the pixel up to the side of the trapezoid is smaller than one half of the pixel, and when the side of the trapezoid has directions of 45 degrees and 135 degrees, the distance from the pixel up to the side of the trapezoid is smaller than one half of diagonal line of the pixel, intersecting points that the left side and the right side of the trapezoid intersect with the boundary of the pixel are determined, whereby when the intersecting point exists, value obtained by multiplying, by density gradation of th picture, a value obtained by normalizing, by the area of the pixel, sum total of areas of trapezoid portions obtained by dividing the trapezoid by linear line passing through the intersecting point and in parallel to the lower bottom side of the trapezoid is caused to be density value of the pixel.

4. A two-dimensional circuit pattern generating method as set for thin claim 1, wherein the plane figure is a figure which can be divided into trapezoid, and the two-dimensional circuit pattern is generated in the manner of developing the two-dimensional circuit pattern configured from the plane figure represented by the divided trapezoids into an image memory in which a plurality of pixels are arranged with an equal distance along vertical and horizontal directions, the method further comprising:

a step of calculating a distance from a pixel center to the oblique side, and a result of judgement as to whether the pixel center is inside or outside of the trapezoid, a step of obtaining an area of the trapezoid occupying in a pixel in which at least one vertex is included, a step of calculating density values of pixels on the basis of any of the distance/judgement—result and the area.

5. A two-dimensional circuit pattern generating apparatus comprises:

trapezoidal coordinate input means for inputting trapezoidal coordinate values and external form dimensions of trapezoid with respect to a circuit pattern;

arithmetic and control means operative to divide the coordinate values and the external form dimensions by size (dimensions) of pixel given in advance to normalize them to judge whether or not sides of the trapezoid are included within individual pixel sizes, whereby in the case where they are included, the arithmetic and control means determines distance from the center point of corresponding pixel size to corresponding size and angle thereof;

picture pattern generating means for generating picture pattern of the circuit on the basis of judgment result as to whether or not respective sides of the trapezoid are included within the pixel by the arithmetic and control means, and data relating to distances and angles in the case where those sizes are included; and an image memory for storing picture pattern relating to the circuit generated by the picture pattern generating means.

6. A two-dimensional circuit pattern generating apparatus as set forth in claim 5, wherein the arithmetic and control means comprises inclusion judging means for judging whether or not the external form dimension of the trapezoid of the normalized coordinate values and external form dimensions is included within the pixel size, and distance calculation means for calculating distance, with respect to pixel which has been judged that the trapezoid is included, between the central point of corresponding pixel and the side included therein and angle thereof.

7. A two-dimensional circuit pattern generating apparatus as set forth in claim 5, wherein the arithmetic and control means comprises:

means for calculating a distance from a pixel center to the oblique side, and a judgement-result as to whether the pixel center is inside or outside the trapezoid;

means for calculating an area of the trapezoid occupying in pixels in which at least one vertex is included; and picture density value generation means for calculating the desnity value of picture on the basis of any of the distance/judgment—result respectively outputted from the means for calculating the distance/judgement—result and the means for calculating the area.

\* \* \* \* \*